(12) United States Patent
Fay

(10) Patent No.: US 6,324,665 B1
(45) Date of Patent: Nov. 27, 2001

(54) EVENT BASED FAULT DIAGNOSIS

(75) Inventor: Thomas R. Fay, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/185,125

(22) Filed: Nov. 3, 1998

(51) Int. Cl.[7] .................................................. G06F 11/00
(52) U.S. Cl. ......................................... 714/736; 714/724
(58) Field of Search ..................................... 714/731, 724, 714/736, 726, 740; 324/158.1, 765; 365/201; 395/500.03

(56) References Cited

U.S. PATENT DOCUMENTS

| | | | |
|---|---|---|---|
| 4,796,259 | * | 1/1989 | Troy ....................................... 714/731 |
| 5,067,130 | * | 11/1991 | Jackson ................................. 714/724 |
| 5,477,139 | * | 12/1995 | West et al. .......................... 324/158.1 |
| 5,937,182 | * | 8/1999 | Allingham ....................... 395/500.03 |
| 5,978,942 | * | 11/1999 | Rockoff ................................. 714/724 |
| 6,028,439 | * | 2/2000 | Arkin et al. ........................... 324/765 |
| 6,055,661 | * | 4/2000 | Luk ....................................... 714/736 |
| 6,061,283 | * | 5/2000 | Takahashi et al. .................... 365/201 |

\* cited by examiner

Primary Examiner—David Ton

(57) ABSTRACT

The present invention is a method and instrument for testing a device. The device under test (DUT) may be an electronic device, circuit, PCB, or product. The present invention compares events measured on a known good DUT with events measured on a potentially faulty DUT. Events on the DUT may be stimulated by injecting one or more input signals into the DUT. Events are observed and measured at signal nodes termed "observation nodes." Events at the observation nodes are recorded and compiled into event lists. Event lists for a potentially faulty DUT are time aligned and compared with event lists for a known good DUT to determine whether the potentially faulty DUT is or is not actually faulty. The present invention can intelligently adapt the selection of observation nodes, on the basis of information about a DUT, to produce the most useful event lists for comparison. The present invention can backtrace through the event lists to determine the earliest or most upstream observation nodes at which the events of the potentially faulty DUT substantially differ from the events of the known good DUT. In this way, the cause of a fault can be isolated and repaired quickly. The present invention also can learn the fault cause and repair information in order to suggest the cause and needed repair when a similar event is observed on another DUT of the same type.

38 Claims, 4 Drawing Sheets

```
NODE 110                                              130
TIME            EVENT
1.06 msec       V=39mV
1.07 msec       V=38mV
1.08 msec       V=38mV
1.09 msec       V=36mV
1.10 msec       V=34mV
1.11 msec       V=33mV
```

```
NODE 115                                              135
TIME            EVENT
1 μsec          CROSS 10% THRESHOLD
13 μsec         CROSS 50% THRESHOLD
25 μsec         CROSS 90% THRESHOLD
39 μsec         MAXIMUM OVERSHOOT=5.25 V
42 μsec         LOCAL MINIMA
45 μsec         LOCAL MINIMA (RINGING FREQUENCY=166.6 kHz)
48 μsec         LOCAL MINIMA
⋮               ⋮
72 μsec         10% SETTLE OF ENVELOPE OF RINGING OSCILLATIONS
```

```
                                                      140
NODE            EVENT
110             START TRIGGER DETECTED
115             0 TO 1 TRANSITION
120             0 TO 1 TRANSITION
125             0 TO 1 TRANSITION
110             1 TO 0 TRANSITION
120             1 TO 0 TRANSITION
125             1 TO 0 TRANSITION
110             STOP TRIGGER DETECTED
```

FIG.4

EVENT BASED FAULT DIAGNOSIS

TECHNICAL FIELD

The present invention relates to fault diagnosis. More particularly, the invention relates to fault diagnosis of electronic circuits or devices utilizing observations of events occurring on the circuits or devices.

BACKGROUND OF THE INVENTION

Functional or operational testing of electronic circuits, printed circuit boards (PCB), devices, and products is well known in the art. Many electronic manufacturing test stations test functional characteristics of electronic equipment. When a device under test (DUT) fails, manufacturers want to repair the device to avoid scrap waste and to maintain production efficiency. However, there is often only a weak relationship between a failure diagnosed by functional testing and the root cause of the failure. Therefore, it is often difficult or impossible to glean repair insight from a functional testing failure.

Current repair practices rely on expert technicians to perform non-obvious repairs based on extra measurements and/or knowledge of the circuit, PCB, device, or product. This approach can be difficult and time consuming. Sometimes the required time investment exceeds the value of the device being repaired, so that scrapping the device is the prudent thing to do. This process can be inefficient and costly for manufacturers.

Most prior art approaches to fault diagnosis are ad hoc. Some manufacturers depend upon technicians to learn a failure-to-fault mapping over time as they gain experience repairing the circuit, PCB, device, or product. This approach suffers from the disadvantages listed above. Also, this approach suffers from the additional disadvantage that the expert repair knowledge stays with the experienced repair technician. Other repair technicians have difficulty gaining the same knowledge.

Another prior art approach is to have a person developing the tests create a failure-cause mapping that can be used by a repair technician. Preparation of such documentation is time consuming and the results are often inaccurate, because it is difficult, if not impossible, to think of all possible causes for a given failure.

Another prior art approach utilizes artificial intelligence diagnostic software to deduce failure causes. Examples of such software are AITEST (TM) and FAULT DETECTIVE (TM), the latter being a product of Hewlett-Packard. Both software packages require creation of a model of the DUT at a logical or electrical level and additional testing information to map failures to device faults. While artificial intelligence diagnostic software is a valuable diagnostic tool, the required models are cumbersome to create, error prone, and difficult to debug.

Another prior art approach utilizes statistics from repairs to develop failure-to-fault mappings in software. This approach is, again, time consuming and requires a repair technician to accurately perform manual data entry that informs the software what got fixed for particular failures.

For purely digital DUTs, there are well known backtracing algorithms that allow backtracing to the source of failures. These algorithms exploit knowledge about how the digital signals should appear on particular signal nodes of the DUT. These algorithms usually require a complicated simulation model of the DUT to develop the stimulus digital signals and calculate the response digital signals for the DUT. Creating a functional test from these digital patterns is difficult, and the technique cannot be applied to more general circuits involving non-digital signals. Furthermore, simulation models usually assume stuck-at faults, which may not cover the full spectrum of faults, even for digital signals.

Another prior art technique is digital signal analysis. This technique is used, for example, by the HP 3060 (TM) test system, a product of Hewlett-Packard. With this technique, a binary digital signal from a DUT is fed into a synchronous linear feedback shift register, which calculates a checksum value for the signal. If the checksum differs from a known good value, a fault is detected. Digital signal analysis can only be utilized where the sampling clocks of the DUT and linear feedback shift register are the same or synchronized. Digital signal analysis is not applicable to analog signals.

SUMMARY OF INVENTION

The event stream fault diagnosis (ESFD) instrument of the present invention is an instrument that monitors or observes important signals of a DUT when attached to a test station. For each observed signal, the instrument extracts significant events occurring on that signal. For example, the ESFD instrument can capture state transition times (0 to 1 or 1 to 0) for a digital signal. For other types of signals, different event data may be observed (e.g., maximum voltage inflection time). In any case, the event data is information about the event and the time at which it occurred or the order of its occurrence relative to other events. The present invention is not limited to digital signals or other specific types of signals, but can be used on any signal, even non-electrical signals, that can be measured over time.

Recorded events at a particular observation node can be compiled into an event list or event stream. The combination of all event streams for all signals observed on a DUT constitutes a record of the performance of the DUT during a test. By recording or constructing these event streams for a known good DUT, a record of correct, known good events can be created. The event stream of a potentially faulty DUT then can be time aligned with and compared to a known good event stream to determine which signals, in any, of the potentially faulty DUT are in error. This comparison can be done by the ESFD instrument automatically.

The present invention can backtrace through event lists to signal nodes upstream iii the circuit to find the first signal node exhibiting a problem. This backtracing involves the ESFD instrument guiding manual or automatic probing of particular signal nodes to find the primary or most upstream failing signal node. Guiding may be based on component connection information and an input/output pin model for each component on the DUT. At each signal node backtraced, the correct event stream for that node can be compared to the observed event stream to decide if the signal node is part of the fault. The key principle of backtracing is to search for the first discrepancy in time from the correct event stream for a signal. The earliest incorrect event in time indicates a primary failing signal node.

Once the primary faulty signal node or nodes have been found, the ESFD instrument can report the nodes and all component pins that affect those nodes. This information can help a repair technician quickly localize repair efforts on the pins and components most likely to be the cause of the test failure of the DUT.

As failures and repairs are done on a particular DUT type, the ESFD instrument can learn specific failure causes related to particular incorrect event streams, and in this way, provide even more accurate diagnosis information to speed repair.

In a preferred embodiment, the ESFD instrument of the present invention comprises several event measurement channels, a controller, memory for storing event information, and a display. Each event measurement channel receives a signal from an observation node of a DUT and measures digital or analog qualities of the signal. The measurement channels may be logic analyzer channels and the measurements may be implemented using digital signal processing (DSP) algorithms.

When considered against the backdrop of the prior art, the present invention provides better fault diagnostics to help a repair person find and fix device defects faster, reducing the cost and increasing the effectiveness of repair.

More specifically, the fault diagnosis instrument and method of the present invention have the following advantages over prior techniques: (1) the present invention is capable of extracting a manageable amount of meaningful data from large amounts of raw test data; (2) the present invention can be added to nearly any existing test station to improve diagnostics; (3) the present invention can be used without programming by the user, because it can learn correct DUT behavior once a known good DUT is available; (4) the present invention speeds repair operations with the first failing DUT, and provides even better repair diagnostics over time; (5) the present invention allows the use of less skilled repair technicians, thus reducing repair costs further; (6) the present invention gathers and stores the information necessary to make fast repairs so that repair technicians not familiar with a particular DUT can still make the repair; (7) the present invention can operate asychronously of the DUT; and (8) the present invention may be practiced with digital or analog DUTs.

These and other advantages of the invention will become apparent to those skilled in the art upon review of the following description, the attached drawings and appended claims.

DESCRIPTION OF THE DRAWINGS

The present invention and its foregoing advantages, together with other benefits which may be attained by its use, will become more apparent upon reading the detailed description of the invention taken in conjunction with the following drawings:

FIG. 4 is an illustration of event lists according to the present invention;

DETAILED DESCRIPTION OF THE INVENTION

Figure 1:
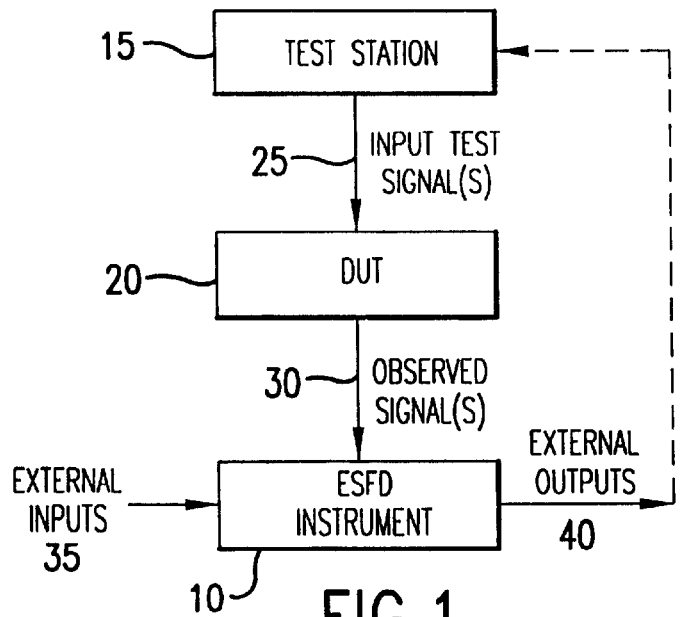
FIGS. 1 is a diagram of an environment of the present invention.

FIG. 1 depicts, in general form, one environment of the present invention. The device of the present invention is an event stream fault diagnosis (ESFD) instrument 10. An exemplary environment of the present invention comprises a test station 15, a device under test (DUT) 20, and an ESFD instrument 10. Test station 15 may provide power, ground, other operational signals, or environmental settings to place DUT 20 into a desired operating state. Test station 15 may also produce input test signals 25 that are output into or about DUT 20. Certain input test signals 25 may be injected into DUT 20 at predetermined nodes. Certain observed test signals 30 are measured within or about DUT 20 at observation nodes and are inputs to ESFD instrument 10. Input test signals 25 may comprise a single signal or plurality of signals. Likewise, observed signals 30 may consist of a single signal or, preferably, comprise a plurality of signals.

In a preferred embodiment of the invention, the plurality of observed signals 30 includes one of the input test signals 25. That is, one of the plurality of observation nodes is the node on which an input test signal is injected. In this manner, ESFD instrument 10 receives at least one signal having known or controllable characteristics even if DUT 20 is faulty. ESFD instrument 10 can utilize such a signal to provide a time reference for events observed within DUT 20.

FIG. 1 also illustrates that ESFD instrument 10 may be capable of receiving external inputs 35 and producing external outputs 40. External inputs 35 may include, for example, information concerning DUT 20, such as layout and component models, fault conditions, or repair information. External outputs 40 may include, for example, a list of events occurring within DUT 20 while under testing or an indication of whether a potentially faulty DUT 20 exhibits the same or similar pattern of events as a known good DUT 20. Some or all of external outputs 40 may be fed back to test station 15 to intelligently control test station 15.

In an alternative environment of the present invention, DUT 20 is a self-testing DUT capable of generating its own test or reference signal. In this case, test station 15 need not generate input test signals 25. Test station 15 need only generate power and stimulus to place DUT 20 into a self-testing state. It is even possible that a self-testing DUT 20 is self-powered and otherwise independently operational, so that test station 15 is not necessary at all.

Figure 2:
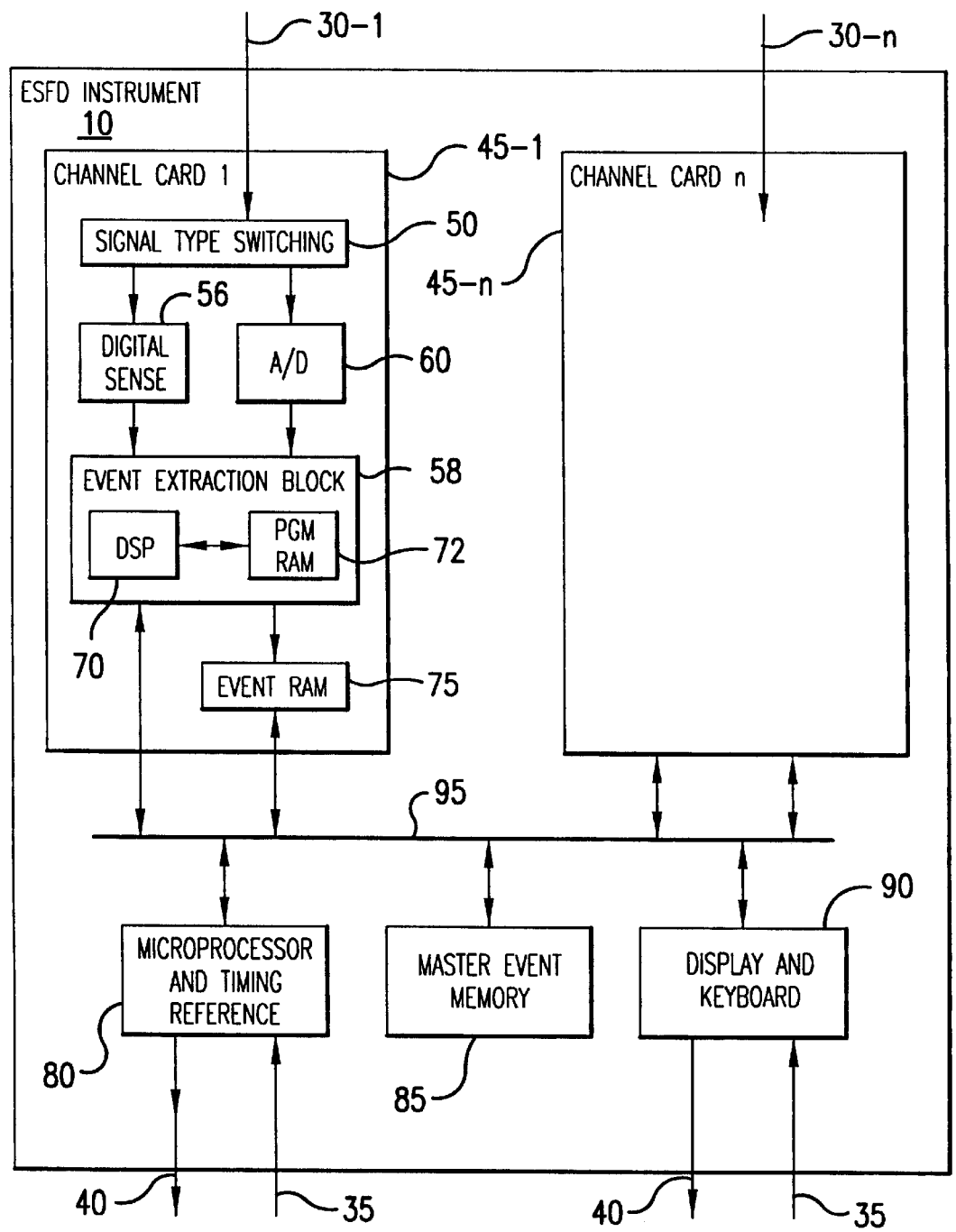
FIG. 2 is a block diagram of internal circuitry of the present invention.

FIG. 2 is a block diagram depicting the internal circuitry of a preferred embodiment of ESFD instrument 10. ESFD instrument 10 comprises one or more measurement channel cards 45-1 ... 45-n. Each measurement channel is similar to a logic analyzer channel. Each measurement channel card functions to take measurements of a corresponding observed signal 30. For example, measurement channel card 1 (denoted 45-1) is depicted as receiving observed signal 30-1. FIG. 2 shows each measurement channel as a separate card, but this need not be the case. Any physical arrangement of the circuitry is possible, including placing a plurality of measurement channels on a single card.

The observed signals 30 will next be described with reference to observed signal 30-1 as an example. Observed signal 30-1 may be a digital or analog electrical signal. Observed signal 30-1 may be a direct measurement of an electrical quantity on DUT 20 or it may be a signal representing a non-electrical physical condition associated with DUT 20. An example of the latter case is observed signal 30-1 being an electrical signal representing a temperature at a certain point in DUT 20 or a pressure or a illumination intensity, etc. Any physical measurement that can be transduced to electrical form can be input into ESFD instrument 10 as an observed signal.

Regardless of what the observed signal represents, the signal is either analog or digital. Therefore, measurement channel 1 (45-1) is capable of measuring analog or digital qualities of the signal. If observed signal 30-1 is a digital signal, then signal type switching block 50 passes the signal 30-1 through to digital sense block 56. Digital sense block 56 senses the 1 and 0 logic states of observed signal 30-1. Observed signal 30-1 might be a TTL, ECL, or other type of digital signal. Digital sense block 56 may, if necessary, be configured to convert from one type of digital signal to the type used by event extraction block 58. Digital sense block 56 also may perform resampling of observed signal 30-1 to obtain a finer resolution in time, voltage, or both. If observed signal 30-1 is in an analog form, then signal type switching block 50 passes observed signal 30-1 to A/D (analog to digital) convertor 60. A/D convertor 60 samples and quantizes observed signal 30-1 according to well known techniques. A/D convertor 60 outputs a digitized version of observed signal 30-1 to event extraction block 58. In this way, analog signals can be analyzed using digital signal processing (DSP) algorithms.

In an alternate embodiment, digital sense block 56 and/or A/D convertor 60 may be level comparators. Digital sense block 56 may be a level comparator with a single threshold level midway between logic 0 and logic 1 voltage values. An analog level comparator may utilize multiple threshold levels, and those levels may be adjustable. With knowledge of the nominal range of signal values, analog threshold levels can be intelligently chosen so that the most important signal events can be detected with a level comparator that is simpler than a conventional A/D convertor.

As an alternative to the embodiment depicted in FIG. 2, an analog observed signal may be measured directly for analog characteristics in analog measurement circuitry. Possible analog qualities that may be measured by analog measurement circuitry include voltage, current, threshold crossing events, frequency of oscillation, period of oscillation, etc., according to well known techniques. In such an alternative, values measured by the analog measurement circuitry are output as a digital value for storage.

Event extraction block 58 performs the function of extracting events occurring in the incoming signal. Event extraction block 58 analyzes the incoming signal, whether from digital sense block 56 or A/D convertor 60, to detect and extract events. In the embodiment illustrated in FIG. 2, event extraction block 58 comprises a processor, such as DSP 70, and memory, such as program RAM (random access memory) 72. DSP 70 performs the processing and computations to detect and extract events from the incoming signal. Program RAM 72 contains the event extraction algorithms that instruct the processing of DSP 70. The output of DSP 70 is data concerning the extracted event. This data is stored in a memory such as event RAM 75, which is preferably a shared memory capable of being accessed by other processors. FIG. 2 is illustrative only. One of skill in the art would recognize that other microprocessors may be utilized in place of DSP 70 and that other memory, such as nonvolatile ROM (read only memory), EPROM (erasable programmable ROM), or EEPROM (electrically erasable and programmable ROM), may be utilized in place of program RAM 72.

In alternative embodiments, the event extraction function of event extraction block 58 can be realized using algorithms different from DSP algorithms. For example, pattern recognition algorithms may be utilized to detect and extract event data. Pattern recognition may be implemented in many forms, including using a neural network. Other non-DSP-based algorithms for event extraction may be based on neural tree networks or Gaussian mixture models. One skilled in the art will recognize many algorithms that are capable of performing the function of event extraction.

Furthermore, in alternative embodiments, the functions of event extraction block 58 may be achieved utilizing a different structure. For example, the processor based architecture illustrated in FIG. 2 for extraction block 58 could be replaced with a custom ASIC (application specific integrated circuit) or a dedicated programmable device such as a PLD (programmable logic device), PAL (programmable array logic) or FPGA (field programmable gate array). Any combination of event extraction structure and algorithm is possible.

Event extraction block 58 preferably operates in real time such that events are extracted and stored in event RAM 75 as the events happen. In an alternative implementation, event extraction block 58 would additionally contain an input buffer memory to hold incoming signal samples. The input buffer memory could be a high speed buffer RAM or other memory having a fast write time to accommodate high rate incoming signals. In this way, DSP 70 could be programmed to perform more complex and time-consuming event extraction computations than can be done in real time.

Events may be time stamped or time tagged. An event may be as simple as a single signal sample. If all signal samples are extracted events, then event RAM 75 would simply contain a collection of every signal sample, possibly time stamped. If every $n^{th}$ signal sample is an extracted event, then the contents of event RAM 75 is a decimation of the signal samples. Other exemplary events include measured current or voltage values, signal crossings above or below a threshold value, time between threshold crossings, local signal minima or maxima, signal inflection points, or events associated with a step response. Other signal events applicable when observed signal 30-1 is a periodic analog signal include RMS voltages, power measurements, dominant or secondary frequencies, or signal envelope characteristics.

A threshold crossing event could be useful when observed signal 30-1 is a binary signal. In such a case, a threshold that is midway between the nominal 0 and 1 logic values is useful to detect the event of a transition between logic states in the signal. Similarly, thresholds that are at the 10% and 90% values between nominal 0 and 1 logic values are useful to extract rise times or fall times during signal transitions, provided that the time and value resolutions of samples presented to event extraction block 58 are sufficiently fine to discriminate such values. If the actual sampling rate is too low for a particular event extraction but high enough to satisfy the Nyquist condition, then DSP 70 can perform well known interpolation algorithms to arrive at a satisfactory internal sampling rate.

As an example of event extraction processing, extraction of events associated with a step response will be described. The step response processing may be applied to a observed binary signal transitioning from a 1 logic state to a 0 logic state to obtain a detailed analysis of the transition, or it may be applied to an analog observed signal such as in a servo control circuit. Detailed events associated with a step response transition may be computed directly if the sampling rate is sufficiently high. If the underlying sampling rate is not sufficiently high but high enough to satisfy applicable Nyquist conditions, then samples may be interpolated in accordance with well known techniques to obtain a sufficiently high resolution of samples. In either case, DSP 70 can compute quantities associated with a step response transition, such as rise time (e.g., 10% to 90% rise time) or fall time. In the case of an underdamped step response, DSP 70 may compute ringing period, ringing frequency, settling time, and decay rate for the envelope of oscillations. Characteristics computed by DSP 70 can be stored as events in event RAM 75.

The other measurement channel cards of ESFD instrument 10 may be the same or similar to measurement channel 1. Certain measurement channel cards may be dedicated for use only with a digital or an analog observed signal. In such a dedicated measurement channel card, only one of digital sense block 56 or A/D convertor 60 is present, and there is no need for signal type switching block 50.

ESFD instrument 10 also comprises, in a preferred embodiment, master controller 80, master event memory 85, and display/keyboard 90. Bus 95 links the measurement channel cards 45, master microprocessor 80, master event memory 85, and display/keyboard 90 together. Display/keyboard 90 accepts external inputs 35 in the form of keyboard inputs and produces external outputs 40 in the form of display outputs. Controller 80 may additionally accept external inputs 35 and produce external outputs 40.

Master controller 80, in the preferred embodiment shown in FIG. 2, can access event RAM 75 via bus 95, if event RAM 75 is a shared memory. In this way, controller 80 can access measurements of a given channel, process those measurements, and produce an event stream, which may be stored in event stream memory 85. An event stream can be displayed in a textual format on keyboard/display 90. Alternatively or additionally, keyboard/display 90 may show a graphical representation of the signals in a time window in which events have been measured and stored. For example in the case of a step response of a signal from a low value to a high value, event RAM 75 may contain events characteristic of the step response, such as rise time, maximum overshoot, etc. This event data is stored in events stream memory 85 and can be seen on keyboard/display 90 in a textual manner. To accompany this textual information, keyboard/display 90 can show a graphical representation of the signal in a time window about this event. This may be accomplished if a sufficient number of simple sample events are extracted and stored in event RAM 75. The same or similar result may be accomplished in an alternative embodiment if event extraction block 58 contains an input buffer memory that is directly connected to bus 95. In such an alternative embodiment, master controller 80 may arrange the transferring and formatting of raw digital samples or an interpolated version of raw digital samples for graphical representation on keyboard/display 90.

In yet another alternative embodiment, master controller 80 may access the same raw samples and perform all or some of the algorithms or processing previously described and attributed to DSP 70.

Master controller 80 may be a general purpose microprocessor or specialized controller whose functions are determined by programmed instructions. Programmed instructions may be in the form of software or firmware, for example. Alternatively, master controller 80 may be a custom ASIC or a dedicated programmable device such as a PLD, PAL or FPGA.

Figure 3:
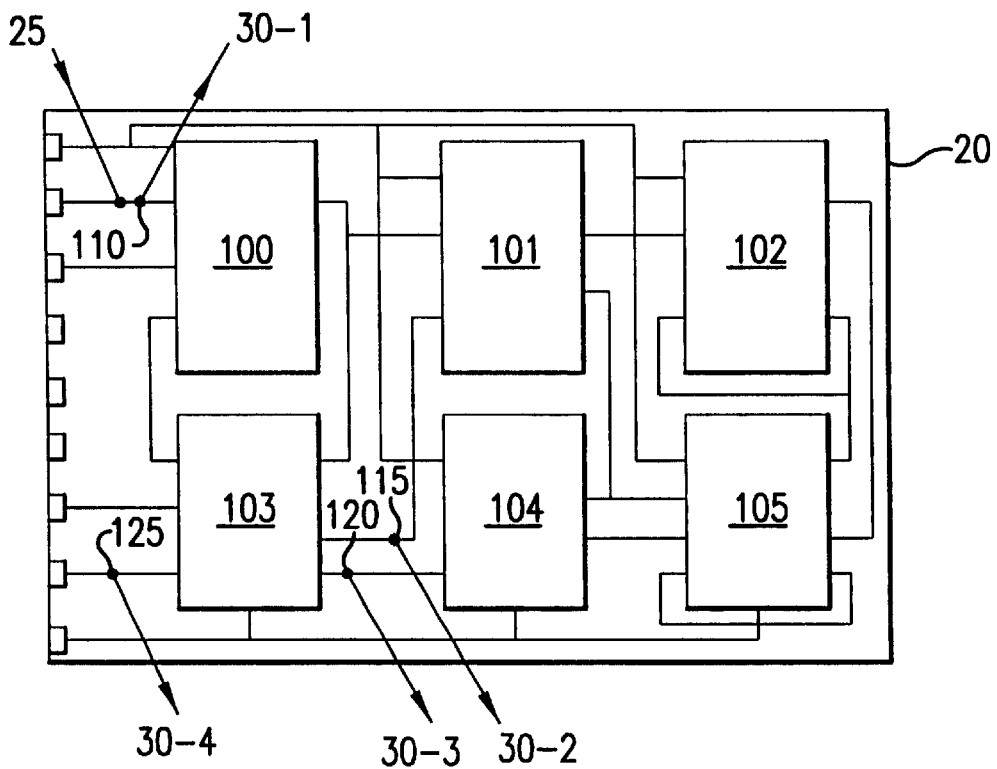
FIG. 3 is an illustration of a device under test (DUT) in use with the present invention.

FIG. 3 depicts an example DUT 20. As shown in FIG. 3, DUT 20 comprises several components 100 . . . 105. A single input test signal 25 is shown injected into the circuit DUT 20 at node 100. Four observed signals 30-1 . . . 30-4 are shown being sensed at nodes 110, 115, 120, and 125, respectively.

In the configuration illustrated in FIG. 3, input test signal 25 and observed signal 30-1 are the same. That is, observation node 100 is the point at which input test signal 25 is injected. In this way, ESFD instrument 10 is able to advantageously utilize a synchronization pattern possibly present in input signal 25. The advantage of having a predetermined synchronization pattern in one of the observed signals is that it enables the signals measured at observation nodes 110, 11 5, 120, and 125 to be synchronized jointly. This is possible not only when the observation signals 30-1 . . . 30-4 are sensed simultaneously, but also under repeated tests having a fixed, known time relationship to the same synchronization pattern. For instance, if different observation nodes in circuit DUT 20 are sensed and input into ESFD instrument 10 such that observed signal 30-1 remains unchanged while the other three observation signal probes are moved to new observation nodes (not shown), then the new set of events observed on the new observation nodes can again be time aligned with the previous set of events sensed at observation nodes 115, 120, and 125. This is possible because the two sets of measurements utilize the same input test signal 25, which is the same observed signal 30-1, containing the same predetermined synchronization pattern. In this manner, any number of measurement sets can be taken on DUT 20 and all measurement sets can be jointly synchronized or time aligned. In this way, the number of observation nodes that can be tested is not limited by the number of test nodes or the number of measurement channels present in ESFD instrument 10. That is, the number of nodes that can be measured can be arbitrarily increased by simply repeating the number of measurement sets. Furthermore, measurement sets across different DUTs can be time aligned with one another by injecting the same synchronization pattern at the same predetermined node on different DUTs. Suitable synchronization patterns, such as Barker codes or PN (pseudonoise) codes, are well known in the art.

In certain uses of the present invention, it is not necessary for input test signal 25 to contain a synchronization pattern. For instance, in the case where DUT 20 is self-testing, DUT 20 may generates its own test or reference signal containing a synchronization pattern. In such a case, a faulty self-testing pattern may be advantageously checked first for failures.

Precise time alignment of events may not be necessary in all uses of the present invention. Simple relative ordering of events may provide sufficient useful information to detect and diagnose a fault. For example, certain violations of digital component setup times may be detectable this way. In such a situation, precise time alignment is unnecessary and synchronization codes may be unnecessary. Furthermore, precise synchronization of events may be impractical for certain DUTs. This is true, for example, whenever there is asynchronous transfer of signals or stochastic response times. An example of the former is an asynchronous bus linking a processor to memory or peripherals. An example of the latter is a disc drive with random access delays. Relative event ordering is appropriate for such DUTs. When time alignment is simply relative event ordering, a simple trigger can replace the more sophisticated synchronization pattern described above. A start trigger and stop trigger may be used to define a window of time in which signal events are observed. These triggers may be part of the input signal or they may be deduced from patterns of signal events on observation nodes. It is also possible to use triggers in conjunction with time stamps. For example, events may be time stamped relative to a start trigger for events occurring between the start and stop triggers.

FIG. 4 illustrates an exemplary collection of event records. The format of FIG. 4 may or may not be the same as the format of displayed event lists displayed on keyboard/display 90. The format depicted in FIG. 4 is not necessarily the schema utilized to store the event stream records in memory 85. FIG. 4 is intended as an illustration only, to convey a better understanding of the present invention. In FIG. 4, an event list 130 for signal node 10 is partially illustrated. Event list 130 is a list of time stamped entries each entry having associated with it a voltage measurement.

Event list 130 may be a simple list of the raw data samples of observed signal 30-1 at observation node 110 at each time sample. Event list 130 may contain a large amount of raw data, which may contain spurious or noise-contaminated samples. However, the amount of data can be limited by collecting data over only a limited period of time, and noisy or spurious samples can be mitigated by processing such as filtering.

FIG. 4 also partially illustrates an event list 135, associated with the observed signal 30-2 at node 115. Event list 135 illustrates events associated with an underdamped step response in observed signal 30-2. At a time stamp of 1 microseconds, a threshold crossing event is recorded, where the threshold represents a value 10% between the initial and final values of the step. At time stamps of 13 and 25 microseconds, other threshold crossing events are recorded. Event list 130 also contains time stamped events of maximum overshoot, ringing oscillation extrema (from which ringing oscillation frequency can be computed), and 10% settling time. Such data may be useful to a technician or engineer in verifying the operation of DUT 20 or particular components in the DUT 20.

Finally, FIG. 4 illustrates a combined events list 140 of events occurring at multiple observation nodes. Whereas event lists 130 and 135 are exclusively specific to nodes 110 and 115, respectively, event list 140 combines significant events from various nodes to represent a more holistic view of the DUT. Event list 140 also illustrates relative ordering rather than time stamping.

Figure 5:
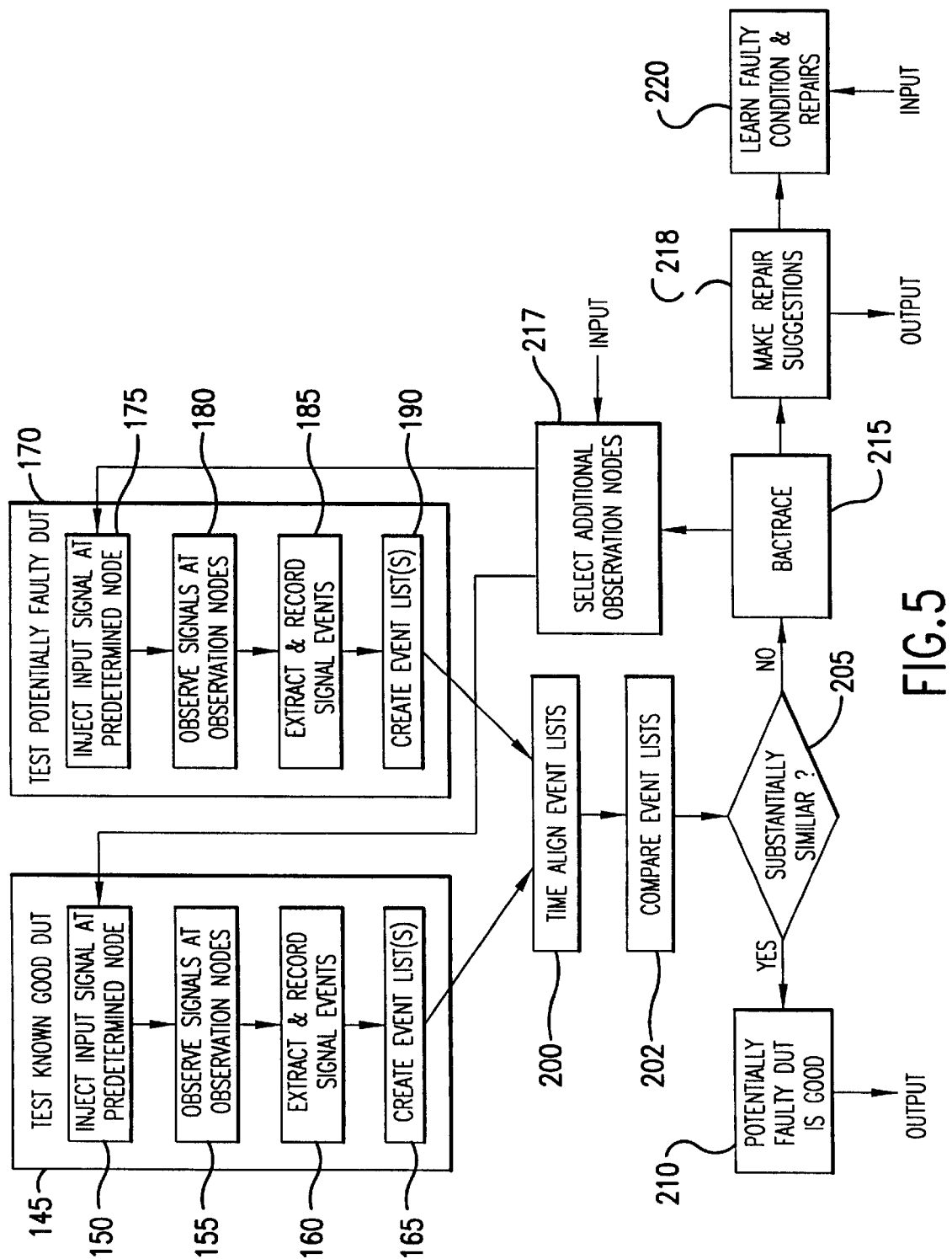
FIG. 5 is an flowchart for testing in accordance with the present invention.

FIG. 5 is a flow chart of a preferred method of the present invention. Block 145 shows the steps involved in ascertaining signal events on a known good or reference DUT. A known good DUT is tested by injecting an input test signal at a predetermined node, as shown by step 150. Step 150 may not be necessary if the DUT is of the self-testing type. Step 155 is the observation of signals at observation nodes. Step 160 is the extraction and recording of signal events, and step 165 is the creation of one or more event lists. Block 145 may not be necessary if analysis, simulation, or other records provide equivalent event data corresponding to a known good DUT.

Block 170 shows the procedure for ascertaining signal events on a potentially faulty or uncertain DUT. In step 175 an input signal is injected into the DUT at a predetermined node. Again, step 175 may not be necessary if the DUT is of the self-testing type. In step 180 signals are observed at observation nodes in the DUT. In step 185 signal events occurring at the observation nodes are extracted and recorded. In step 190 one or more event lists are created. All of the events at a particular observation node can be listed on one list or record. Alternatively, events at several observation nodes can be recorded together in a single list or record.

Next, at steps 200 and 202, the event lists for the known good DUT and the potentially faulty DUT are time aligned and compared for differences. In order for the comparison to be meaningful, the two event lists must be aligned in time. The time alignment may be accomplished by having within one of the observation signals at an observation node a predetermined synchronization pattern. The synchronization pattern can be an event recorded in the event lists. As described earlier, the predetermined synchronization pattern may be part of the input signal, for example, as a preamble, where one of the observation nodes is the same as the predetermined node at which the input test signal is injected. If the input signal is the same on the known good device and the potentially faulty device, it is present in both event lists and therefore can be used as a basis to time align the event lists. After time alignment and comparison, a decision is made at step 205 as to whether the event lists are substantially similar. If the answer is yes, then the method proceeds to final step 210, and the conclusion is that the potentially faulty device is a good device.

If there is a substantial difference between the two event lists, the method proceeds to step 215. At step 215, backtracing is performed through the event lists to find the earliest or most upstream event where there is a difference between the known good device and the potentially faulty device. The earliest different event is the event whose time stamp or relative order is such that it occurred first in time. Searching for the earliest different event is backtracing in time. It is also possible to backtrace in space through the circuit topology of DUT 20, if knowledge of the layout and components of DUT 20 are available. Signal flow through DUT 20 is in the direction from upstream to downstream. Signals are input or originate at a most upstream node. Signals are output or terminate at a most downstream node. By backtracing to earliest or the most upstream node where a difference in signal events is evident, valuable troubleshooting information is obtained. Such an earliest or most upstream different event occurs at a primary failing observation node. The components immediately preceding or succeeding the primary failing node are very likely to include a faulty component. If the primary failing node is an input node, an erroneous input signal may be indicated.

If the result of step 215 is a failure to find a single event that is associated with a meaningful primary failing node, then the method may proceed to step 217 to select additional observation nodes further upstream for additional event extraction and comparison. Additional observation nodes could be selected from either the known good DUT, the potentially faulty DUT, or both. However, it is likely that only the potentially faulty DUT is tested further and observed at additional observation nodes. In a high throughput testing scenario, a potentially faulty DUT may be initially tested by observing minimal events (e.g., final outputs only), because a high volume of potentially faulty DUTs must be tested. On the other hand, time can be effectively spent more thoroughly observing events on a single known good DUT. Therefore, it is possible that the number of observation nodes and events is greater in block 145 than in block 170. In general terms, this relationship can be characterized in that the set of observation nodes or events on a potentially faulty DUT is a subset of the set of observation nodes or events on a known good DUT. This characterization both cases of the set of potentially faulty observation nodes or events being equivalent to or a proper subset of the set of known good observation nodes or events.

When a potentially faulty DUT is in fact faulty according to the initially observed events, it may be worthwhile to probe the potentially faulty DUT further by selecting additional observation nodes, as shown in step 217. With input information regarding the layout and components of the DUT, the steps of block 170 can be repeated at additional observation nodes in the potentially faulty DUT to compare more thoroughly events of the potentially faulty DUT with those of the known good DUT. The additional events can augment or supplant the event lists for the potentially faulty DUT and be time aligned and compared to the event lists of the known good DUT. In this way, the method proceeds iteratively to pinpoint primary nodes where failure events occur.

If backtracing is not attempted or is not successful, then the method of the present invention may simply output the event list created at step 190. In such a case, the event list of step 190 may be annotated with indications of whether each event conforms or does not conform with events of a known good DUT. As a further alternative, both the event lists of steps 165 and 190 may be output together for convenient comparison. As just described, the present invention can provide valuable diagnostic information without backtracing. Such diagnostic information can be utilized by a repair person to focus additional diagnostic efforts more efficiently.

If backtracing is successfully executed, the method has identified the primary failing nodes and the erroneous events occurring at those nodes. The method then proceeds to step 218 where data concerning the primary failing node and its erroneous events is compared to a database of known failure conditions on DUTs of the same type. As shown in FIG. 5, the method at step 218 outputs repair suggestions to the user of the invention. Alternatively or additionally, the output of step 218 may be the identity of the most upstream nodes where erroneous failure events have been observed. The database of known failure conditions may be created from the knowledge of an repair technician or engineer experienced with that type of DUT, or the database may be self-learned by the present invention, as next described in relation to step 220, or both.

At step 220, the method learns the faulty condition by associating DUT repair information inputted by a user of the present invention with the event lists, particularly the most upstream different event in the event list of the potentially faulty DUT. For example, if a repair person notices that the faulty condition requires repair of a certain sort or replacement of a certain component, the input shown going into step 220 may be the repair procedure or components verified to be faulty. Such repair or faulty condition information may be useful at step 218 in a subsequent test of a potentially faulty DUT of the same type where the same most upstream different event at the same primary failing node is observed. Steps 218 and 220 may cooperate and implement expert systems or artificial intelligence techniques to learn and report failure causes and repair information.

The acts and functions illustrated in FIG. 5 may be performed by corresponding structure. For example, in the structures illustrated in FIG. 2, the steps and functions of blocks 145 may be performed by measurement channels 45 and/or master controller 80, and the acts and functions of steps 200-220 may be performed by modules of master controller 80. A module may be hardware, firmware, and/or software. That is, master controller 80 may comprise one or more of the following: time alignment module, comparison module, similarity determination module, backtracing module, additional node/signal selection module, repair suggestion module, and learning module. Alternatively, some or all of the preceding modules may be implemented in separate structures.

The preceding description in relation to FIG. 5 is for the case where the reference DUT is a known good DUT and the uncertain DUT is a potentially faulty DUT of the same type. However, the invention is not so limited. The invention also can be used to sort or distinguish a batch of DUTs of possibly mixed type. In such a use, the invention is capable of determining whether an uncertain DUT is substantially similar to a reference DUT. This use of the invention has utility to quickly and automatically determine the identity of a DUT based on a simple, well defined electrical or signal event difference, such as may be present between variations of devices (e.g., as between different generations or production runs of the same device, different manufacturers, or otherwise).

The terms and descriptions used herein are set forth by way of illustration only and are not meant as limitations. In particular, the ESFD instrument architecture illustrated in FIG. 2 is only one exemplary implementation; the event data illustrated in FIG. 4 is not meant to be exhaustive; and the operations illustrated in FIG. 5 need not all be performed, may be performed in different sequences, or may be performed simultaneously (i.e., multitasking). Those skilled in the art will recognize that numerous variations are possible within the spirit and scope of the invention as defined in the following claims.

What is claimed is:

1. A method for testing an uncertain device, the method comprising:

ascertaining reference signal events occurring in one or more signals at one or more respective nodes of a reference device;

ascertaining uncertain signal events occurring in one or more signals at one or more respective nodes of the uncertain device;

creating one or more reference event lists comprising some or all of the uncertain signal events;

creating one or more uncertain event lists comprising some of all of the uncertain signal events;

comparing the reference event list with the uncertain event list;

determining, on the basis of the comparing step, whether the uncertain device is substantially similar to the reference device; and time aligning the uncertain signal events with the reference signal events before the step of comparing, wherein at least one of the signals at a node on the reference device contains a synchronization pattern, the signal on the same node of the uncertain device contains the same synchronization pattern, and the time aligning step comprises:

determining the time shift between the synchronization patterns on the same node of the reference and uncertain devices.

2. The method of claim 1 wherein the steps of ascertaining uncertain signal events comprises:

observing the one or more uncertain signals at the one or more respective nodes of the uncertain device; and extracting uncertain signal events occurring in the one or more uncertain signals.

3. The method of claim 2 wherein at least one of the one or more uncertain signal is an analog signal, and the steps of determining uncertain signal events further comprises:

converting the at least one analog uncertain signal to a digital signal.

4. The method of claim 2 wherein the steps of determining uncertain signal events further comprises:

injecting an input signal into the uncertain device at a predetermined node.

5. The method of claim 1 further comprising:

time stamping the reference signal events; and time stamping the uncertain signal events.

6. The method of claim 1 further comprising:

identifying any uncertain signal events that substantially differ from the reference signal events.

7. The method of claim 1 wherein the nodes of the devices are related in an upstream-downstream fashion, the method further comprising:

backtracing through the signal events in the upstream direction to determine one or more most upstream nodes where the uncertain signal events substantially differ from the reference signal events.

8. The method of claim 7 wherein nodes where the uncertain signal events substantially differ from the reference signal events include one or more primary failure nodes, the method further comprising:
reporting the one or more primary failure nodes.

9. The method of claim 1, wherein the time aligning step comprises:
relative ordering of events.

10. The method of claim 1 wherein the reference device and the uncertain device are of the same type, and the reference device is a potentially faulty version of the type of device.

11. A method for testing an uncertain device, the method comprising:
ascertaining reference signal events occurring in one or more signals at one or more respective nodes of a reference device, at least one of the one or more signals being an analog signal, the step of ascertaining comprising:
observing the one or more uncertain signals at the one or more respective nodes of the uncertain device; and
extracting uncertain signal events occurring in the one or more uncertain signals;
ascertaining uncertain signal events occurring in one or more signals at one or more respective nodes of the uncertain device;
comparing the uncertain events with the reference events;
determining, on the basis of the comparing step, whether the uncertain device is substantially similar to the reference device, the step of determining comprising the step of converting the at least one analog uncertain signal to a digital signal; and
obtaining a plurality of samples from the at least one analog signal, wherein the digital signal comprises the plurality of samples, and at least one of the samples denotes the start of an uncertain signal event.

12. The method of claim 11, the step of obtaining a plurality of samples from the at least one analog signal comprising:
repetitively sampling the at least one analog signal; and
determining the occurrence of specified events.

13. The method of claim 12, wherein the step of determining the occurrence of specified events comprises determining at least one of a threshold crossing event, an oscillation frequency, and an oscillation period.

14. A method for testing an uncertain device, the method comprising:
ascertaining reference signal events occurring in one or more signals at one or more respective nodes of a reference device;
ascertaining uncertain signal events occurring in one or more signals at one or more respective nodes of the uncertain device;
comparing the uncertain events with the reference events;
determining, on the basis of the comparing step, whether the uncertain device is substantially similar to the reference device;
accepting input related to a condition of the uncertain device; and
learning that the extracted uncertain signal events are associated with the inputted condition, whereby the inputted condition can be reported when substantially similar uncertain signal events are observed in another uncertain device.

15. A method for testing an uncertain device, the method comprising:
ascertaining reference signal events occurring in one or more signals at one or more respective nodes of a reference device;
ascertaining uncertain signal events occurring in one or more signals at one or more respective nodes of the uncertain device;
comparing the uncertain events with the reference events;
determining, on the basis of the comparing step, whether the uncertain device is substantially similar to the reference device;
accepting device information comprising layout information and component information;
selecting one or more additional nodes on the basis of the device information; and
ascertaining additional uncertain signal events, each additional uncertain signal event occurring in a signal at one of the one or more additional nodes.

16. A test instrument comprising:
one or more event measurement channels, each channel accepting an observed signal and comprising:
a processor connected to process the accepted observed signal; and
a program memory, connected to the processor, containing processing instructions that are executed by the processor, the processing instructions including one or more event extraction algorithms;
a master controller, in communication with the one or more event measurement channels, capable of processing outputs of the one or more event extraction algorithms;
an event comparison module that compares lists of extracted events, a list of extracted events being comprised of either reference signal events obtained from signals at one or more nodes of a reference device or uncertain signal events obtained from signals at one or more nodes of an uncertain device; and
a time alignment module, the time alignment module aligning the uncertain signal events before comparison in the event comparison module, wherein at least one of the signals at a node on the reference device contains a synchronization pattern, the signal on the same node of the uncertain device contains the same synchronization pattern, and the time alignment module determines a time shift between the synchronization patterns on the same nodes of the reference and uncertain devices.

17. The test instrument of claim 16 wherein the one or more event measurement channels further comprise an event memory, connected to the processor, that stores outputs of the one or more event extraction algorithms.

18. The test instrument of claim 16 wherein at least one of the one or more event measurement channels comprises an analog to digital convertor, connected to the processor, that receives the accepted observed signal.

19. The test instrument of claim 16 wherein at least one of the one or more event measurement channels comprises a level comparator, connected to the processor, that receives the accepted observed signal.

20. The test instrument of claim 16 further comprising:
a master event memory, in communication with the master controller, that stores data concerning extracted events.

21. The test instrument of claim 16 further comprising:
a display, in communication with the master controller, that is capable of displaying event data.

22. The test instrument of claim 16 further comprising:
an input device, in communication with the master controller, that is capable of accepting external input.

23. The test instrument of claim 16 wherein the master controller is a microprocessor.

24. The test instrument of claim 16 further comprising:
a similarly determination module.

25. The test instrument of claim 16 further comprising:
a backtracing module.

26. The test instrument of claim 16 further comprising:
an additional observed signal selection module.

27. The test instrument of claim 16 further comprising:
a repair suggestion module.

28. A test instrument comprising:
one or more event measurement channels, each channel accepting an observed signal and comprising:
means for extracting events occurring in the accepted observed signal;
means, connected to the one or more event measurement channels, for determining substantial similarity of extracted events;
a master controller, in communication with the one or more event measurement channels, capable of processing the extracted events;
an event comparison module that compares lists of the extracted events, a list of extracted events being comprised of either reference signal events obtained from signals at one or more nodes of a reference device or uncertain signal events obtained from signals at one or more nodes of an uncertain device; and
a time alignment module, the time alignment module aligning the uncertain signal events before comparison in the event comparison module, wherein at least one of the signals at a node on the reference device contains a synchronization pattern, the signal on the same node of the uncertain device contains the same synchronization pattern, and the time alignment module determines a time shift between the synchronization patterns on the same nodes of the reference and uncertain devices.

29. The test instrument of claim 28 wherein the one or more event measurement channels further comprise an event memory, connected to the means for extracting events, that stores outputs of the means for extracting events.

30. The test instrument of claim 28 wherein at least one of the one or more event measurement channels comprises an analog to digital convertor, connected to the means for extracting events, that receives the accepted observed signal.

31. The test instrument of claim 28 wherein at least one of the one or more event measurement channels comprises a level comparator, connected to the processor, that receives the accepted observed signal.

32. The test instrument of claim 28 further comprising:
a master event memory, in communication with the master controller, that stores data concerning the extracted events.

33. The test instrument of claim 28 further comprising:
a display, in communication with the master controller, that is capable of displaying event data.

34. The test instrument of claim 28 further comprising:
an input device, in communication with the master controller, that is capable of accepting external input.

35. The test instrument of claim 28 wherein the master controller is a microprocessor.

36. The test instrument of claim 28 further comprising:
means, connected to the one or more event measurement channels, for backtracing.

37. The test instrument of claim 28 further comprising:
means, connected to the one or more event measurement channels, for selecting additional observed signals.

38. The test instrument of claim 28 further comprising:
means, connected to the one or more event measurement channels, for making repair suggestions.

* * * * *